United States Patent
Hembree (10) Patent No.: US 6,267,650 B1
(45) Date of Patent: Jul. 31, 2001

(54) APPARATUS AND METHODS FOR SUBSTANTIAL PLANARIZATION OF SOLDER BUMPS

(75) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/370,498

(22) Filed: Aug. 9, 1999

(51) Int. Cl.[7] .................................................. B24B 1/00
(52) U.S. Cl. ............................ 451/49; 451/68; 451/388
(58) Field of Search .................................. 451/49, 6, 8, 5, 451/41, 285–289, 388; 228/254

(56) References Cited

U.S. PATENT DOCUMENTS

| | | | |
|---|---|---|---|
| 5,216,843 | * 6/1993 | Breivogel et al. | 451/287 X |
| 5,435,482 | 7/1995 | Variot et al. | 228/254 |
| 5,575,706 | * 11/1996 | Tsai et al. | 451/285 X |
| 5,643,048 | * 7/1997 | Iyer | 451/285 X |
| 5,658,190 | * 8/1997 | Wright et al. | 451/285 |
| 5,663,797 | 9/1997 | Sandhu | 438/16 |
| 5,738,567 | 4/1998 | Manzonie et al. | 451/41 |
| 5,745,986 | 5/1998 | Variot et al. | 3/34 |
| 5,901,437 | 5/1999 | Variot et al. | 3/34 |
| 5,989,937 | 11/1999 | Variot et al. | 438/108 |

OTHER PUBLICATIONS

"*Amicon® E 1350 No Flow–Fluxing Underfill for Flip Chip, CSP, or BGA Devices*," Emerson & Cuming, Apr. 1999.
*Using Silicon Contacts to Test and Burn–In Flash Memory, Microprocessors, and FPGA's*, International Conference on Multichip Modules and High Density Packaging, Aug. 1998.
"*Chip Scale Packaging is Your Route to the Most Compact Portables*", Portable Design, pp. 16, 18, 20 and 22, Feb. 1999.
"*CSP Suppliers Shift Into High Gear*", Electronic Packaging & Production, pp. 75–81, Feb. 1999.
"Exploiting the Opportunities of Area Array Packaging," Electronic Packaging & Production, pp. 87–91, Feb. 1999.
"*The Developement of a Top–Bottom–BGA (TB–BGA)*", 1998 International Conference on Multichip and High Density Packaging, pp. 247–252, Aug. 1998.
"*High Speed Assembly with CSP's*", SMT, pp. 76–81, Nov. 1998.
"*Stripping Hell: Small Holes and Thick Panels*", Emerson & Cuming, Apr. 1999, http://www.finishin.com/Liberty/restriphel.html.

* cited by examiner

*Primary Examiner*—Joseph J. Hail, III
*Assistant Examiner*—Anthony Ojini
(74) *Attorney, Agent, or Firm*—Dorsey & Whitney LLP (57) ABSTRACT

Apparatus and methods for substantial planarization of solder bumps. In one embodiment, an apparatus includes a planarization member engageable with at least some of the plurality of outer surfaces to apply a planarization action on one or more of the outer surfaces to substantially planarize the plurality of outer surfaces, and a securing element to securely position the bumped device during engagement with the planarization member. Through application of "additive" and/or "subtractive" processes, the solder balls are substantially planarized. In alternate embodiments, the planarization member includes a cutting tool and the planarization action comprises a milling action; or the planarization member includes a heated platen and the planarization action comprises a thermo-mechanical deformation action; or the planarization member includes an abrasive surface and the planarization action comprises a grinding action; or the planarization member includes a chemical solution and the planarization action comprises a chemical reaction; or the planarization member includes a solder deposition device and the planarization action comprises a solder. In a further embodiment, an apparatus includes a load device to urge the at least some outer surfaces of the bumped device into engagement with the planarization member.

12 Claims, 5 Drawing Sheets

APPARATUS AND METHODS FOR SUBSTANTIAL PLANARIZATION OF SOLDER BUMPS

TECHNICAL FIELD

The present invention relates to apparatus and methods for substantial planarization of solder bumps for use in, for example, testing and fabrication of chip scale packages, bumped die, and other similar devices.

BACKGROUND OF THE INVENTION

The demand for smaller packaging of electronic components continues to drive the development of smaller chip scale packages (CSP's), bumped die, and other similar devices having solder bumps, ball grid arrays (BGA's), or the like. As a result, spacing (or "pitch") between adjacent solder balls on bumped devices has steadily decreased. Typical requirements for ball pitch have decreased from 1.27 mm to 0.5 mm or less, and the trend continues.

Figure 1:
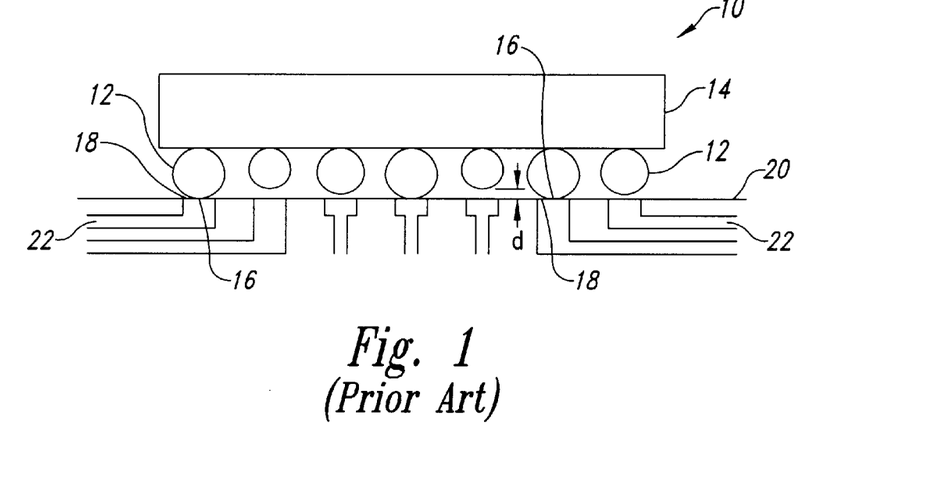
FIG. 1 is a side elevational view of a bumped device engaged with a printed circuit board in accordance with the prior art.

FIG. 1 is a side elevational view of a typical bumped device 10 (CSP, bumped die, etc.) mounted on, for example, a printed circuit board 20. The bumped device 10 includes a plurality of solder balls 12 attached to a plurality of ball pads (not shown) which are formed on a die 14. Each solder ball 12 has an outer edge 16 that aligns with a corresponding contact pad 18 on the printed circuit board 20. A conductive lead 22 is attached to each contact pad 18. Ideally, the outer edge 16 of each solder ball 12 contacts the corresponding contact pad 18 during assembly of the bumped device 10 with the printed circuit board 20, completing the electrical circuit between the conductive leads 22 and the die 14.

The height and width of the solder bumps 12 on the bumped device 10 are not precisely uniform. Variation of the solder bump height and width depends on several factors, including variation in size of the original unattached solder balls, variation in the sizes of the ball pads, and differences in the attachment process.

As the demand for smaller packaging continues, however, CSP reliability concerns arise. For example, using typical manufacturing methods and solders, the nominal variation between the tallest and shortest balls (shown as the distance d on FIG. 1) is presently about 60 microns ($\mu$m). Therefore, when the device 10 is placed on a flat surface resting on the solder balls, the three tallest balls or bumps define the seating plane of the device, and the smaller balls do not touch the corresponding contact pads of the printed circuit board or test interposer.

During assembly, and in some cases during testing, a moderate compression force may be applied to the bumped device 10 to drive the outer surfaces 16 of the solder balls 12 into contact with the contact pads 18 of the printed circuit board or test interposer 20. Typically, the compression force needed to bring the solder bumps into contact with the contact pads varies between 30 grams and 2000 grams depending upon the manufacturing or test process involved. The applied compression force should be kept to a minimum, however, because larger forces may damage the circuitry of the die 14, the CSP solder balls, or the test interposer.

One approach to the problem is to mount the contact pads 18 of the test interposer 20 on micro-springs. As the tallest solder bumps engage the micro-spring mounted contact pads, the micro-springs are compressed, allowing the shorter solder balls to engage the corresponding contact pads. Numerous micro-spring contact pad models are available as shown and described in Robert Crowley's article in *Chip Scale Review* published May 1998, p. 37, incorporated herein by reference. Although desirable results may be achieved with such devices, micro-spring mounted contact pads 18 are very expensive, relatively difficult to maintain, and may excessively damage the solder ball itself.

During assembly of the bumped device 10 with the printed circuit board 20, some of the shorter solder balls may not solder to their associated contact pads during the reflow process. In the past, to increase the numbers of solder balls making contact with the contact pads during reflow, the volume of the solder balls was increased. As packaging sizes and pitch requirements continue to decrease, however, the volume of the solder balls must be reduced accordingly, and thus, the percentage of balls that will not attach to the contact pads during reflow increases. Again, if considerable force is applied during assembly, the CSP or the printed circuit board 20 may be damaged.

SUMMARY OF THE INVENTION

The present invention is directed toward apparatus and methods for substantial planarization of solder bumps for use in, for example, testing and fabrication of chip scale packages, bumped die, and other similar devices. In one embodiment, an apparatus in accordance with the invention includes a planarization member engageable with at least some of the plurality of outer surfaces, and a securing element engageable with the bumped device to securely position the bumped device during engagement with the planarization member. During engagement with the at least some outer surfaces, the planarization member applies a planarization action on one or more of the outer surfaces to substantially planarize the plurality of outer surfaces. In one embodiment, the planarization member includes a cutting tool and the planarization action comprises a milling action. In another embodiment, the planarization member includes a heated platen and the planarization action comprises a thermo-mechanical deformation action. In yet another embodiment, the planarization member includes an abrasive surface and the planarization action comprising a grinding action. Alternately, the planarization member includes a chemical solution and the planarization action comprises a chemical reaction. In yet another embodiment, the planarization member includes a solder deposition device and the planarization action comprises a solder deposition.

Alternately, an apparatus may include a planarization gauge that measures a planarization condition of the outer surfaces. The planarization gauge may measure the planarization condition before or after the planarization member is engaged with the outer surfaces.

In a further embodiment, an apparatus includes a load device engageable with at least one of the bumped device or the planarization member to urge the at least some outer surfaces of the bumped device into engagement with the planarization member. The planarization member applies a planarization action on one or more of the plurality of outer surfaces to substantially planarize the plurality of outer surfaces.

In one embodiment, the planarization member includes a substantially flat surface and the load device includes a mass having a weight that urges the at least some outer surfaces into engagement with the flat surface to mechanically flatten the surfaces. In another embodiment, the load device includes a fixed surface and a pressurizable vessel, a pressure in the pressurizable vessel urging the bumped device away from the fixed surface and into engagement with the planarization member. In yet another embodiment, the load device includes a press engageable with the bumped device. In still another embodiment, the load device includes a centrifuge engageable with the planarization member.

DETAILED DESCRIPTION OF THE INVENTION

The following description is generally directed toward apparatus and methods for substantial planarization of solder bumps for use in, for example, testing and fabrication of chip scale packages, bumped die, and other similar devices. Many specific details of certain embodiments of the invention are set forth in the following description and in FIGS. 2–10 to provide a thorough understanding of such embodiments. One skilled in the art, however, will understand that the present invention may have additional embodiments, or that the present invention may be practiced without several of the details described in the following description.

Figure 2:
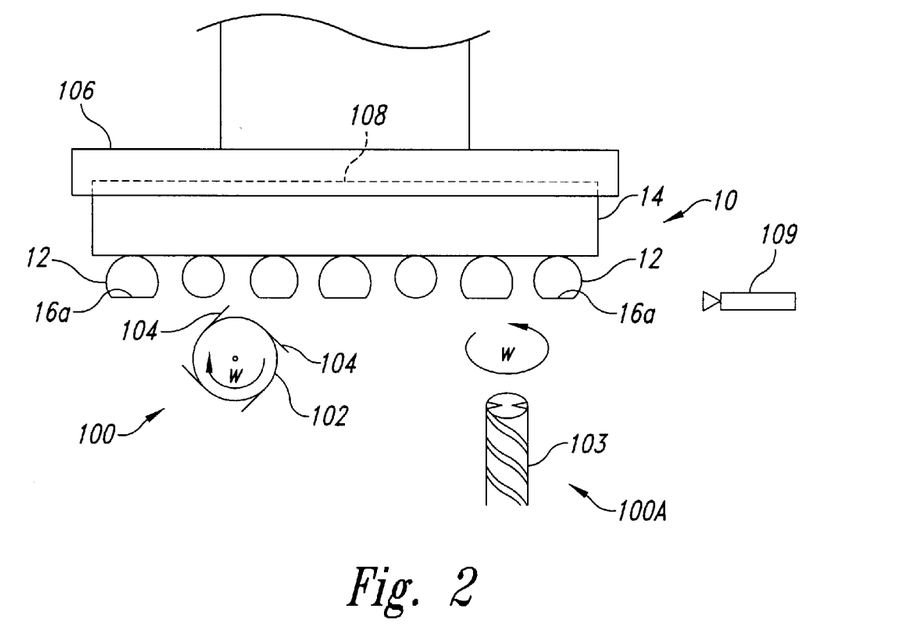
FIG. 2 is a side elevational view of the bumped device of FIG. 1 engaged with a planarization apparatus in accordance with an embodiment of the invention.

FIG. 2 is a side elevational view of a bumped device 10 engaged with a planarization apparatus 100 in accordance with an embodiment of the invention. In this embodiment, the planarization apparatus 100 includes a rotating cutting head 102 with a plurality of cutting blades 104. A securing element 106 having a recess 108 adapted to receive the bumped device 10 is engaged with the bumped device 10 to secure the bumped device 10 in position during engagement of the solder balls 12 with the cutting head 102. A planarization gauge (or sensor) 109 is positioned proximate the bumped device 10 to measure (or sense) a planarization condition of the outer surfaces 16 of the solder balls 12.

As used throughout the following discussion, the term "bumped device" refers not only to the bumped die depicted in FIG. 2, but also to a wide variety of microelectronics devices having solder bumps, including CSP's, flip-chips, ball grid array (BGA) packages, and micro-BGA packages. Furthermore, the term bumped device is intended herein to include multiples or combinations of bumped devices, such as an entire wafer of bumped dice prior to die singulation, or an entire handling tray containing multiple bumped packages.

In operation, the securing element 106 secures the bumped device 10 in position for engagement of the bumped device 10 with the cutting head 102. As the cutting head 102 is moved along the bumped device 10 (or vice versa), the cutting blades 104 rotate (as indicated by arrow w) and engage the outer surfaces 16 of the tallest solder bumps 12. The cutting blades 104 perform a planarization action (i.e. subtractive cutting or milling) on the outer surfaces 16 of one or more of the bumps 12. After engagement of the bumped device 10 with the planarization member 100, the gauge 109 may be used to check the outer surfaces 16, 16a to determine whether the solder balls 12 are all approximately the same height. If the outer surfaces are not planarized to the desired tolerance, the planarization apparatus 100 may be re-engaged with the outer surfaces 16, 16a one or more times until the balls are substantially planarized.

The terms "planarized" and "planarization" are used throughout this discussion to refer to the fact that the solder balls 12 are made to be approximately the same height—that is to say, the solder balls project from the bumped device by approximately the same distance or thickness. It is not intended to imply that the outer surfaces 16 of all of the solder balls 12 are made flat. As shown in FIG. 2, the planarization apparatus 100 need not engage all of the solder balls 12, and solder balls of different heights are engaged to different degrees. The actual number of solder balls engaged by the planarization apparatus 100 will depend upon the height variation of the balls of the array. Thus, some of the outer surfaces 16a of the solder balls 12 may be flattened, and some will remain rounded. Following application of the planarization action, the plurality of solder balls on the bumped device will be substantially (i.e. approximately) the same height, a condition referred to as "substantially planarized."

In an alternate embodiment, as shown in FIG. 2, a planarization member 100A includes a cutting tool 103 that is oriented approximately perpendicular to the die 14. The cutting tool 103 may be positioned on a controllably driven base (not shown) and may be sized to apply a planarization action on a single solder bump 12. Thus, rather than flattening a row or group of solder bumps 12 in a batch mode, the cutting tool 103 allows individual solder balls 12 to be selected for milling. The cutting tool 103 could also be used to remove most or all of a damaged ball. The ball could then be replaced by installation of a pre-formed ball, or by successive deposition of layers of solder using a solder deposition process, as described more fully below.

One may note that the planarization gauge 109 is depicted in FIG. 2 as being an optical device that senses the planarity of the outer surfaces 16, 16a, such as the type of laser-based gauges disclosed in U.S. Pat. No. 5,663,797 to Sandhu for detecting the endpoint in chemical-mechanical polishing of semiconductor wafers. The gauge 109, however, may be of any type that is suitable for detecting the heights of the solder bumps, including feeler gauges that physically contact the solder bumps or non-contacting capacitative-type height gauges. Alternately, the planarization gauge 109 may be incorporated into either the planarization member 100, 100A or the securing element 106, or by proper control of the planarization member and securing element, the gauge may be eliminated.

It should be noted that the gauge 109 could measure all the balls 12 on the package 10 and then the planarization member 100, 100A could be directed to only mill off the "tallest" balls. The balls chosen to receive the planarization action could be determined by, for example, a software program.

The software program could accept input signals from the gauge 109 and transmit control signals to a controller which controllably positions the planarization member 100, 100A to act on the tallest solder balls 12, thus substantially planarizing the solder balls in a fully-automated, controlled fashion.

Figure 3:
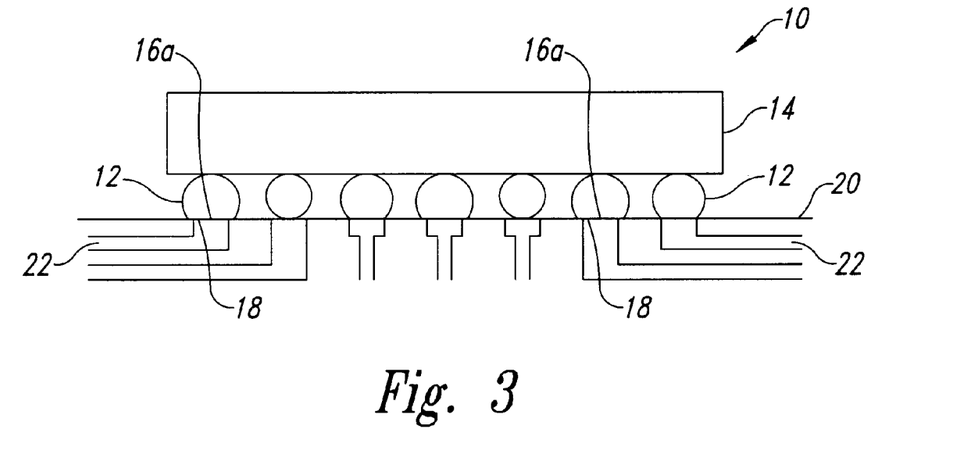
FIG. 3 is a side elevational view of the bumped device engaged with the printed circuit board of FIG. 1 following substantial planarization of the bumps in accordance with the invention.

FIG. 3 is a side elevational view of the bumped device 10 engaged with the printed circuit board 20 of FIG. 1 following substantial planarization of the outer surfaces 16, 16a. After engagement with the planarization apparatus 100, most or all of the outer surfaces 16, 16a are in contact with the corresponding contact pads 18 on the printed circuit board 20.

An advantage of substantially planarizing the outer surfaces 16, 16a of the bumped device 10 is that testing of the die 14 is significantly enhanced. Because the solder balls 12 are brought into contact with the contact pads 18 with minimal applied force, reliable testing of the die may be achieved without damaging the circuitry of the die.

Another advantage of substantially planarizing the outer surfaces of the solder bumps is that expensive micro-spring contact devices are eliminated. Significant cost and maintenance savings may be realized using the relatively simple, economical planarization member compared with the purchase or fabrication of a test interposer having micro-spring mounted contact devices.

Figure 4:
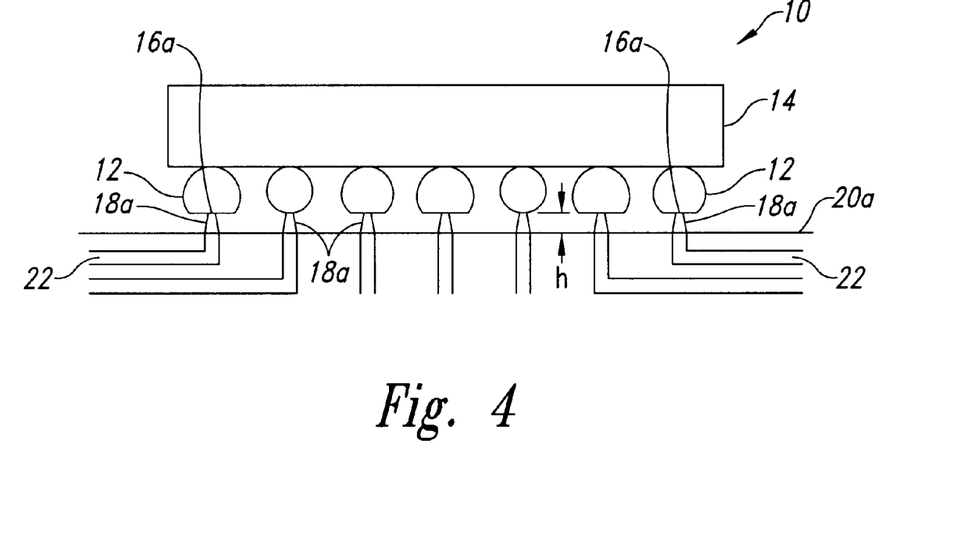
FIG. 4 is a side elevational view of the bumped device of FIG. 1 engaged with a device having protruding contacts.

Yet another advantage is realized when the substantially planarized outer surfaces 16a are engaged with a device 20a (e.g. printed circuit board, test interposer, etc.) having protruding or pedestal-shaped contacts 18a. FIG. 4 shows the bumped device 10 having substantially planarized solder bumps 12 engaged with a test interposer 20a having protruding contacts 18a. Without planarization of the solder bumps 12, the height h of the protruding contacts 18a, would need to be on the order of 60 μm—the nominal variation between the tallest and shortest balls without planarization (shown as distance d on FIG. 1).

When the outer surfaces of the solder balls are substantially planarized, however, the variation of solder ball heights is reduced so that the required pedestal contact height is reduced accordingly. With the solder balls substantially planarized, the required height of the protruding contacts 18a on the test interposer 20a, for example, is reduced to about 20 μm, which is just enough to penetrate a layer of surface oxides on the solder balls for testing of the bumped device 10. By reducing the height requirement of the protruding contacts, substantial savings in manufacturing costs of the protruding contacts is achieved.

Figure 5:
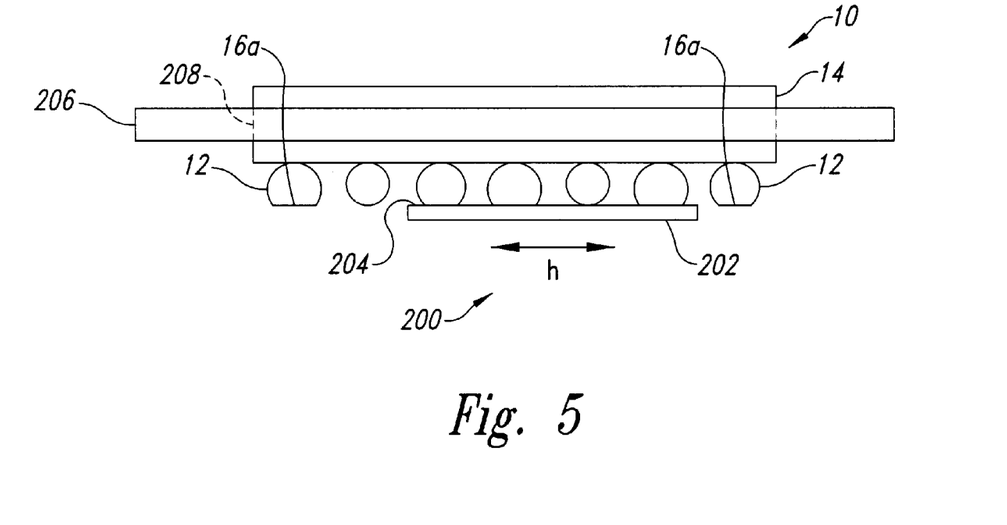
FIG. 5 is a side elevational view of the bumped device of FIG. 1 engaged with a planarization apparatus in accordance with an alternate embodiment of the invention.

FIG. 5 is a side elevational view of the bumped device 10 of FIG. 1 engaged with an alternate embodiment of a planarization apparatus 200 in accordance with the invention. In this embodiment, the planarization apparatus 200 includes a heated platen 202 having a substantially flat surface 204 engageable with the outer surfaces 16 of the solder balls 12, and a securing element 206 having an aperture 208 therethrough. The bumped device 10 is securely engaged within the aperture 208 so that the securing element 206 secures and positions the device during engagement with the heated platen 202.

As the heated platen 202 is engaged with the outer surfaces 16, the outer surfaces are heated by the flat surface 204 of the platen. Depending upon the temperature of the platen 202, and the period of contact with the platen, the outer surfaces may be softened and mechanically flattened by the flat surface 204, or may be heated until the solder sublimates. In either case, these thermo-mechanical actions performed by the heated platen 202 on the solder balls 12 substantially planarize the outer surfaces 16a to an approximately uniform height.

One may note that if temperature of the platen 202 is high enough to liquify the solder, then the platen 202 is preferably made of a material that the solder will not wet to. Also, if the platen 202 is removed from the ball while the ball is still in a liquid state, then the surface tension of the ball may cause the ball to reform into its original undesirable spherical shape. Thus, if the platen 202 temperature is sufficient to liquify the solder ball 12, then after the ball has been liquified and mechanically reformed, it is preferable that the platen 202 temperature be reduced while the platen remains in contact with the ball 12 until the solder ball solidifies into a substantially planarized shape.

Although the heated platen 202 is shown in FIG. 5 as only contacting four of the solder balls 12, it is apparent that the platen may be made as large or as small as desirable. The platen may, for example, be coextensive with all the balls of the bumped device 10. Alternately, the heated platen may be configured to contact only one ball (or one row) at a time, such as by using a roller, a blade, a squeegee, or other configuration.

Numerous alternate embodiments of planarization apparatus are conceivable. For example, in one alternate embodiment, the planarization apparatus 200 includes a grinding member 202 having an abrasive surface 204 engageable with the outer surfaces 16 of the solder bumps 12. In this embodiment, the grinding member 202 is laterally moveable (indicated in FIG. 4 by the double-headed arrow h) with respect to the solder bumps 12. As the grinding member 202 is moved, the abrasive surface 204 performs a grinding action on one or more of the bumps 12, thereby substantially planarizing the outer surfaces 16a.

Alternately, the grinding member may rotate with respect to the bumps in a manner similar to the chemical-mechanical polishing (CMP) devices for planarization of silicon wafers, including, for example, the types disclosed in U.S. Pat. No. 5,738,567 to Manzonie and Akram. The abrasive surface 204 may be used with a polishing solution that helps to dissolve the outer surfaces of the solder bumps, or an abrasive slurry that assists in the physical removal of material from the outer surfaces. Furthermore, planarization apparatus in accordance with the invention may be used to planarize the solder balls of flip-chip devices while still in whole wafer form, prior to die singulation of the wafer.

In another alternate embodiment, the planarization apparatus 200 includes a reactive member 202 having a chemically-coated or wetted surface 204. As the wetted surface 204 is engaged with the outer surfaces, a chemical action is performed on the solder bumps which dissolves the outer edges of the tallest bumps, making the bumps approximately the same height and substantially planarizing the outer surfaces 16, 16a. Suitable chemicals for coating or wetting the surface 204 for chemically reacting with the solder balls are known in the industry, as discussed in greater detail below. Many alternate embodiments of securing elements are available, including, for example, those having recesses (FIG. 1), apertures (FIG. 2), pinching mechanisms, clamping mechanisms, or suction mechanisms. In general, all types of securing elements that securely position the bumped device during engagement with the planarization member are acceptable.

Figure 6:
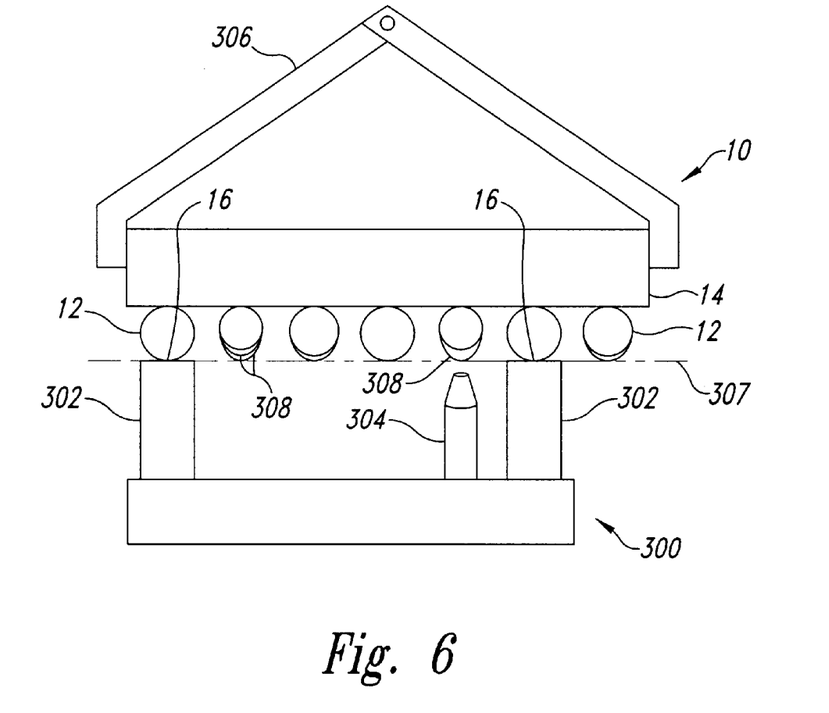
FIG. 6 is a side elevational view of the bumped device of FIG. 1 engaged with an alternate embodiment of a planarization apparatus in accordance with the invention.

FIG. 6 is a side elevational view of the bumped device 10 of FIG. 1 engaged with an alternate embodiment of a planarization apparatus 300 in accordance with the invention. In this embodiment, the planarization apparatus 300 has a pair of contact posts 302 that contact the outer surfaces 16 of the solder balls 12, and a solder deposition device 304. The solder deposition device 304 deposits a solder buildup layer 308 on selected solder balls 12. A securing element 306 pinches the substrate 14 of the bumped device 10 to securely position the device during engagement with the solder deposition device 304.

In operation, the contact posts 302 systematically contact the outer surfaces 16 of at least some of the solder balls 12 to determine the highest solder balls 12. The highest solder balls then define a seating plane 307. For example, for a two-dimensional array of solder balls, the seating plane 307 may be defined by the three tallest balls or, if desired, from the single tallest ball. Similarly, for a single row of solder balls, the seating plane 307 may be determined from the two tallest balls or the single tallest ball. Once the seating plane 307 is established, the solder deposition device 304 is positioned over each of the shorter solder balls and deposits one or more buildup layers of solder 308 on each of the shorter balls. The buildup layers 308 are successively applied until the height of each solder ball reaches the seating plane 307 through an "additive" planarization process, and the outer surfaces are substantially planarized.

One may note that the process involving definition of the seating plane 307 may be employed equally well with the planarization apparatus that employ "substractive" planarization actions, such as the rotating cutter or the heated platen. Furthermore, through combination of various "substractive" and "additive" processes, damaged balls may be partially or wholly removed and replaced until the solder balls 12 are substantially planarized. Thus, the inventive apparatus and processes may be used to rework or repair bumped devices 10 with missing or damaged solder balls.

Although the planarization apparatus 300 is shown in FIG. 6 as having two contact posts 302, it should be recognized that many alternative ways of defining the seating plane 307 exist. For example, the planarization apparatus 300 may have only a single contact post that is used to sample the heights the solder bumps, or may have a contact post for each of the solder bumps on the bumped device 10.

Also, the planarization apparatus 300 may have a single, adjustably positionable solder deposition device 304 as shown in FIG. 6, or many solder deposition devices, such as one solder deposition device per solder bump. The solder deposition device 304 may include a solder jet, or a solder ball bumper, or other suitable device. Representative, commercially-available devices include the drop-on demand solder jet systems from MPM Corporation of Franklin, Mass., or the solder ball bumper Model $SB^2M$ from Packaging Technologies, GmbH of Germany.

It may also be noted that the seating plane 307 may be defined at any desired intermediate level that is somewhere between the highest and lowest bumps. In that case, the solder deposition device 304 could be used to build up the heights of the shorter solder bumps 12, while another planarization member (e.g. cutting head, heated platen, etc.) could be used to reduce the heights of the taller solder bumps until all of the solder bumps are substantially planarized.

Figure 7:
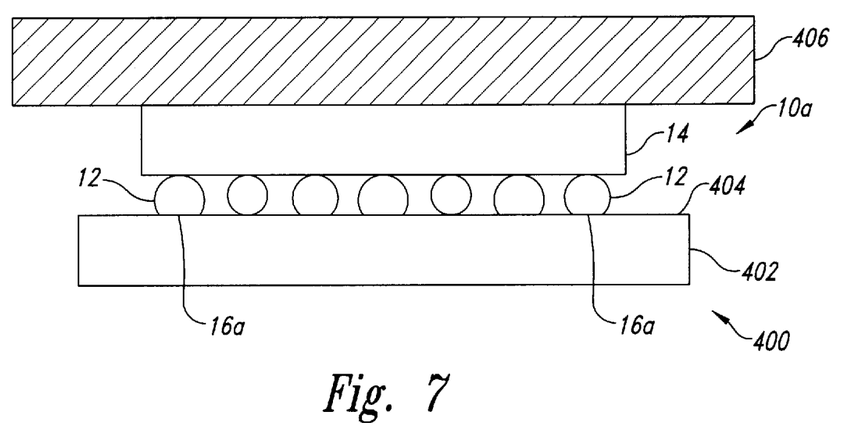
FIG. 7 is a side elevational view of an alternate embodiment of a planarization apparatus in accordance with the invention.

FIG. 7 is a side elevational view of an alternate embodiment of a planarization apparatus 400 in accordance with the invention. This embodiment of the planarization apparatus 400 is suitable for use with, for example, a bumped device 10a that is capable of withstanding a moderate or larger compression load without sustaining damage. The planarization apparatus 400 includes a planarization chuck 402 having a substantially flat surface 404, and a retaining mass 406 engaged with the substrate 14 of the bumped device 10a.

In operation, the bumped device 10a is positioned with the solder balls 12 facing the flat surface 404 of the planarization chuck 402, and the retaining mass 406 is engaged onto the bumped device 10a. The retaining mass 406 secures the bumped device 10a into engagement with the planarization chuck 402, and the weight of the retaining mass 406 compresses the solder balls 12 against the flat surface 404, flattening the outer surfaces 16 of some or all of the balls, particularly the tallest balls. The compression caused by the weight of the retaining mass mechanically deforms the outer surfaces 16a, thereby substantially planarizing the outer surfaces 16, 16a of the solder balls. Thus, the planarization member 400 advantageously provides the benefits of substantial planarization of the solder balls using a simple, inexpensive, and easily maintainable system.

Figure 8:
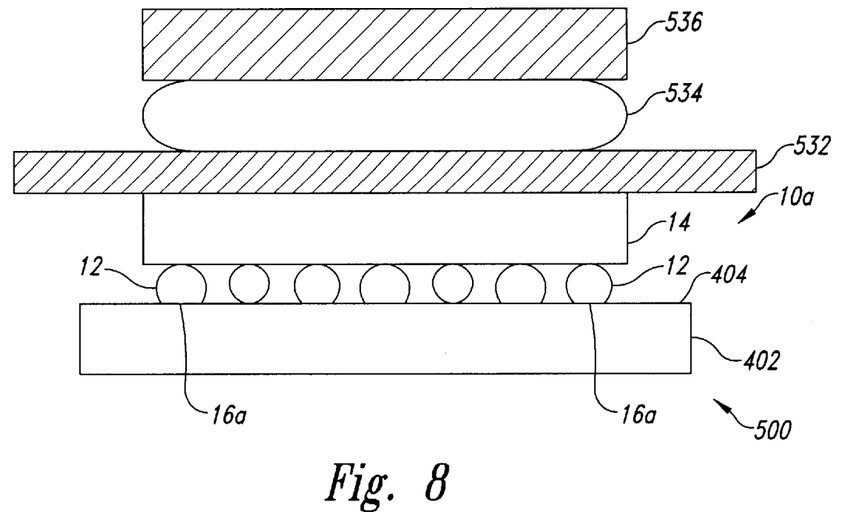
FIG. 8 is a side elevational view of another alternate embodiment of a planarization apparatus in accordance with the invention.

It should be noted that the compression force that flattens the outer surfaces 16a of the solder balls can be generated in many different ways. FIG. 8, for example, shows an alternate embodiment of a planarization apparatus 500 having a pressure plate 532 engaged against the bumped die 10a opposite from the planarization chuck 402. A pressurizable vessel 534 is positioned above the pressure plate 532, and a fixed wall 536 is positioned over the pressurizable vessel 534. As the pressurizable vessel 534 is inflated, the pressure in the vessel forces the pressure plate 532 downward against the bumped die 10a, compressing the solder balls 12 against the flat surface 404 and flattening the outer surfaces 16a.

In another embodiment, the pressure plate 532 is removed, and the pressurizable vessel 534 engages the bumped die 10a directly to apply the compression force. Alternately, the compression force could be generated by any number of devices which are commonly known in the industry, including, for example, a press, a motor and mechanical linkage, or other devices.

Figure 9:
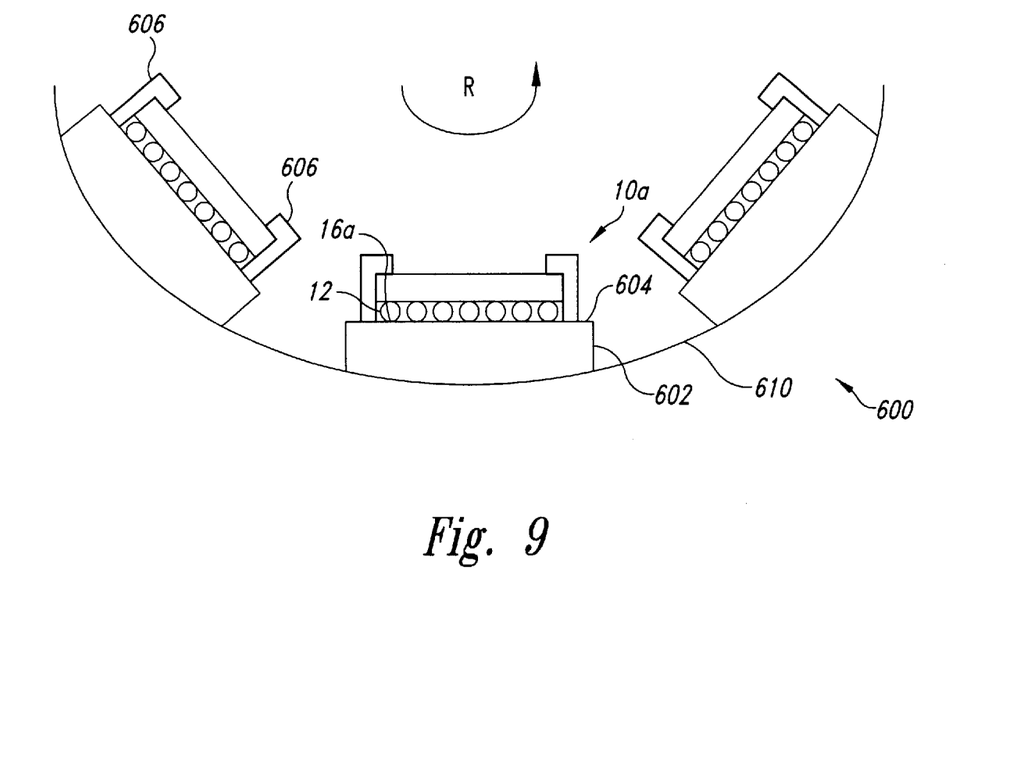
FIG. 9 is a side elevational view of yet another alternate embodiment of a planarization apparatus in accordance with the invention.

FIG. 9 is a side elevational view of yet another embodiment of a planarization apparatus 600 in accordance with the invention. In this embodiment, the planarization apparatus 600 includes a planarization chuck 602 having a substantially flat surface 604, and a centrifuge 610. A pair of securing members (or clips) 606 engage and secure the bumped device 10a in position on the planarization chuck 602 with the solder balls 12 of the bumped device 10a engaged with the flat surface 604.

In operation, the centrifuge 610 is rotated as depicted by arrow R. The rotation of the centrifuge generates a centrifugal force that compresses the bumped device 10a against the planarization chuck 602. During acceleration (and deceleration) of the centrifuge 610, the securing members 606 secure the bumped device 10a in position on the planarization chuck 602. As the rotational velocity of the centrifuge 610 increases, a centrifugal force begins to press some or all of the solder bumps 12 into the flat surface 604, substantially flattening the outer surfaces 16a against the flat surface 604. As shown in FIG. 8, one or more planarization chucks 602 may be disposed within the centrifuge 610 for simultaneously planarizing more than one bumped device 10a. The centrifuge 610 advantageously eliminates the use of weights, pressurization vessels, or other devices used to generate the compression force.

Figure 10:
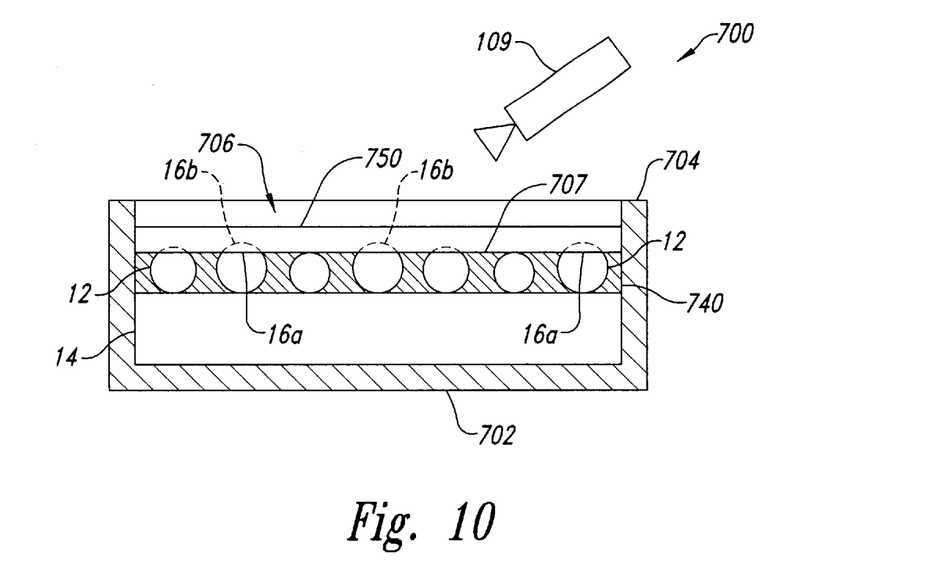
FIG. 10 shows a partial cross-sectional view of still another embodiment of a planarization apparatus in accordance with the invention.

FIG. 10 shows a partial cross-sectional view of still another embodiment of a planarization apparatus 700 in accordance with the invention. In this embodiment, the planarization apparatus 700 includes a receptacle 702 having a retaining wall 704. The retaining wall 704 partially encloses a receiving space 706 that is sized to receivably engage the bumped device 10. With the bumped device 10 placed in an inverted position within the receiving space 706, the retaining wall 704 projects above the outer surfaces 16b of the tallest solder bumps 12 (shown in dashed lines). A protective layer 740 is disposed on the bumped device 10 within the receiving space 706, the protective layer 740 at least partially surrounding and encasing the solder bumps 12. The protective layer 740 includes an upper surface 707. A reactive solution 750 is disposed within the receiving space 706 on the upper surface 707 of the protective layer 740, and a planarization gauge 109 is positioned proximate the receptacle 702.

In operation, the protective layer 740 is formed so that its thickness is approximately equal to the height of the shortest solder bump 12. The upper surface 707 thereby defines a seating plane through which the outer surfaces 16b project. The reactive solution 750 is then deposited into the receiving space 706 to chemically react with and dissolve (i.e. etch) the outer surfaces 16b of the solder bumps 12. The protective layer 740 is comprised of one or more materials that are resistive or inert to the reactive solution 750. As the reactive solution 750 etches the projecting portion of the outer surfaces 16b, the planarization gauge 109 monitors a planarization condition of the seating plane and outer surfaces (as discussed above). When the outer surfaces 16a are substantially planar with the upper surface 707, the reactive solution 750 is removed. The protective layer 740 is then etched or dissolved using a suitable solution or other process (e.g. by heating) that removes the protective layer but does not harm the solder bumps 12. The heights of the solder bumps 12 on the bumped device 10 are thereby substantially planarized.

Suitable reactive solutions 750 for etching the solder balls 12 are known, and include, for example, ammonium bifluoride/peroxide, nitric/ferric nitrate acid, nitric/hydrofluoric acid, or a two-step combination of nitric acid followed by ferric chloride. Similarly, suitable materials for the protective layer 740 are widely known.

The planarization gauge 109 could be incorporated into the receptacle 702, such as by being disposed within the retaining wall 704. Alternately, by proper control or calibration of the reactive solution 750 and/or the solder composition, the planarization gauge 109 may be eliminated.

In an alternate embodiment, the bumped device 10 is re-positioned with the solder bumps 12 projecting downwardly, and the reactive solution 750 is contained in a vat or reservoir below the bumped device 10. Using a suitable securing element, the bumped device 10 could be controllably lowered (or the reservoir of reactive solution raised) until some or all of the outer surfaces 16, but at least the outer surfaces 16b of the tallest solder bumps, come into contact with the reactive solution 750. The reactive solution 750 then etches and dissolves the outer surfaces that come into contact with the reactive solution, dissolving the outer surfaces and substantially planarizing the solder bumps.

In this embodiment, the protective layer 740, the retaining wall 704, and the planarization gauge 109 may be eliminated. Thus, the benefits of substantial planarization of the solder balls 12 are achieved using a relatively simple, easily maintainable planarization system.

The above-described embodiments of planarization apparatus, and their equivalents, provide improved testing, manufacture, and packaging of bumped devices by substantially planarizing the outer surfaces of the solder balls. By substantial planarization of the solder bumps, the compression forces needed to engage the solder balls 12 into contact with the contact pads 18 or a test interposer, printed circuit board, or other bumped device are substantially reduced or eliminated, thereby improving reliability and avoiding damage to the bumped device. Expensive alternatives, such as micro-spring contact pads, are eliminated. Another advantage is that substantial planarization of the solder balls improves the engagement of the bumped device with a device having pedestal or protruding contacts, simplifying the manufacturing and reducing the cost of such devices.

The detailed descriptions of the above embodiments are not exhaustive descriptions of all embodiments contemplated by the inventor to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other apparatus and methods for substantial planarization of solder bumps, and not just to the apparatus and methods described above and shown in the figures. In general, in the following claims, the terms used should not be construed to limit the invention to the specific embodiments disclosed in the specification and the claims, but should be construed to include all apparatus and methods that operate under the claims to provide substantially planarized solder bumps. Accordingly, the invention is not limited by the foregoing disclosure, but instead its scope is to be determined by the following claims.

What is claimed is:

1. An apparatus for substantially planarizing a plurality of outer surfaces of an array of solder bumps attached to a bumped device, comprising:

a planarization member engageable with at least some of the plurality of outer surfaces, the planarization member applying a planarization action on one or more of the plurality of outer surfaces to substantially planarize the solder bumps;

a securing element engageable with the bumped device to securely position the bumped device during engagement of the planarization member with the outer surfaces; and a planarization gauge engageable with at least a portion of the outer surfaces to assess a planarization condition of the solder bumps.

2. The apparatus of claim 1 wherein the planarization member includes a cutting tool and the planarization action comprises a milling action on the one or more outer surfaces.

3. The apparatus of claim 1 wherein the at least some outer surfaces engageable by the planarization member include the one or more outer surfaces upon which the planarization action is applied.

4. The apparatus of claim 1, further comprising a load device engageable with the planarization member or the bumped device, or both, to urge the at least some outer surfaces into engagement with the planarization member.

5. An apparatus for approximately planarizing a plurality of solder bumps, comprising:

a planarization member engageable with at least some of the plurality of solder bumps to apply a planarization action on one or more of the plurality of solder bumps to approximately equalize the heights of the solder bumps on a bumped device;

a securing element engageable with the bumped device to securely position the bumped device during engagement of the planarization member with the solder bumps; and a planarization gauge engageable with at least a portion of the solder bumps to assess a planarization condition of the solder bumps.

6. The apparatus of claim 5, further comprising a load device engageable with the planarization member or the bumped device, or both, to urge the at least some solder bumps into engagement with the planarization member.

7. The apparatus of claim 5 wherein the planarization member includes a cutting tool and the planarization action comprises a milling action on the one or more outer surfaces.

8. The apparatus of claim 5 wherein the at least some solder bumps engageable by the planarization member include the one or more outer surfaces upon which the planarization action is applied.

9. An apparatus for substantially planarizing a plurality of outer surfaces of an array of solder bumps attached to a bumped device, comprising:

a cutting tool engageable with at least some of the plurality of outer surfaces, the cutting tool applying a milling action on one or more of the plurality of outer surfaces to substantially planarize the solder bumps; and a securing element engageable with the bumped device to securely position the bumped device during engagement of the cutting tool with the outer surfaces.

10. The apparatus of claim 9, further comprising a planarization gauge engageable with at least a portion of the outer surfaces to assess a planarization condition of the solder bumps.

11. The apparatus of claim 9 wherein the at least some outer surfaces engageable by the cutting tool include the one or more outer surfaces upon which the milling action is applied.

12. The apparatus of claim 9, further comprising a load device engageable with the cutting tool or the bumped device, or both, to urge the at least some outer surfaces into engagement with the cutting tool.

* * * * *